United States Patent
Wu et al.

(10) Patent No.: US 11,978,686 B2
(45) Date of Patent: May 7, 2024

(54) CHIP PROTECTIVE FILM AND METHOD FOR MANUFACTURING SAME, AND CHIP

(71) Applicant: Wuhan Choice Technology Co, Ltd, Wuhan (CN)

(72) Inventors: De Wu, Wuhan (CN); Shuhang Liao, Wuhan (CN); Liu Zhang, Wuhan (CN); Junxing Su, Wuhan (CN)

(73) Assignee: Wuhan Choice Technology Co, Ltd., Wuhan (CN)

( * ) Notice: Subject to any disclaimer, the term of this patent is extended or adjusted under 35 U.S.C. 154(b) by 0 days.

(21) Appl. No.: 18/459,006

(22) Filed: Aug. 30, 2023

(65) Prior Publication Data
US 2024/0014085 A1    Jan. 11, 2024

Related U.S. Application Data

(63) Continuation of application No. PCT/CN2023/087230, filed on Apr. 10, 2023.

(30) Foreign Application Priority Data

Jul. 6, 2022    (CN) .......................... 202210784970.X

(51) Int. Cl.
*H01L 23/29* (2006.01)
*H01L 21/56* (2006.01)

(52) U.S. Cl.
CPC ............ *H01L 23/295* (2013.01); *H01L 21/56* (2013.01)

(58) Field of Classification Search
CPC ..... H01L 21/56; H01L 23/295; H01L 23/293; H01L 23/3192; H01L 23/3135
See application file for complete search history.

(56) References Cited

U.S. PATENT DOCUMENTS

2020/0158922 A1*   5/2020   Hayashi ..................... C08J 7/18

FOREIGN PATENT DOCUMENTS

| CN | 109880411 A | 6/2019 |
| CN | 113444199 A | 9/2021 |
| CN | 114141922 A | 3/2022 |

* cited by examiner

Primary Examiner — Dale E Page
Assistant Examiner — Abbigale A Boyle
(74) Attorney, Agent, or Firm — Nitin Kaushik

(57) ABSTRACT

Disclosed are a chip protective film, a method for manufacturing the same, and a chip, which relate to the technical field of electronic chip protective films. The chip protective film includes: a first protective layer, and a second protective layer attached to at least a portion of a surface of the first protective layer. The second protective layer includes by mass: 90%-97% acrylate compounds; 0.1-5% fluorine-containing compounds; and a second adjuvant. The chip protective film features strong adhesion, low friction coefficient, high hardness, and good scratch resistance, which effectively solves the technical problem in the prior art that chip protective films are not scratch resistant.

7 Claims, 3 Drawing Sheets

CHIP PROTECTIVE FILM AND METHOD FOR MANUFACTURING SAME, AND CHIP

CROSS-REFERENCE TO RELATED APPLICATIONS

The present disclosure claims priority to Chinese Patent Application No. 202210784970X, filed on Jul. 6, 2022, entitled "Chip Protective Film and Method for Manufacturing the Same, and Chip", which is incorporated herein by reference in its entirety.

TECHNICAL FIELD

The present disclosure relates to the technical field of electronic chip protective films and, more particularly, to a chip protective film, a method for manufacturing the same, and a chip.

BACKGROUND

To ensure that an electronic chip has a certain strength and can be conveniently marked, it is necessary to adhere a film on the back of the chip having a circuit on its surface. The film plays the role of protecting the electronic chip and bearing marks such as the model and trademark of the electronic chip. However, the chip protective films in the prior art are defective because they are not scratch resistant.

SUMMARY

Through one or more embodiments of the present disclosure, a chip protective film, a method for preparing the same, and a chip are provided to solve the technical problem of poor scratch resistance of the chip protective films in the prior art.

In a first aspect of the present disclosure, a chip protective film is provided, including: a first protective layer, and a second protective layer attached to at least a portion of a surface of the first protective layer; the second protective layer includes by mass: 90%-97% acrylate compounds, 0.1%-5% fluorine-containing compounds, and a second adjuvant.

In a second aspect of the present disclosure, a method of manufacturing the chip protective film in the first aspect is provided, including: obtaining a first protective layer; applying a second protective layer on at least a portion of a surface of the first protective layer and post-curing to obtain the chip protective film.

In a third aspect of the present disclosure, a chip is provided, including: a chip substrate, and the chip protective film in the first aspect, which is attached to at least a portion of a surface of the chip substrate.

BRIEF DESCRIPTION OF DRAWINGS

In order to illustrate the technical solution in the embodiments of the present disclosure more clearly, a brief description will be given below with reference to the accompanying drawings which are necessary in the description of the embodiments. Apparently, the drawings in the description below are some of the embodiments of the present disclosure, and those of ordinary skills in the art may obtain other drawings based on these drawings without involving any inventive effort.

DETAILED DESCRIPTION OF THE EMBODIMENTS

Figure 1:
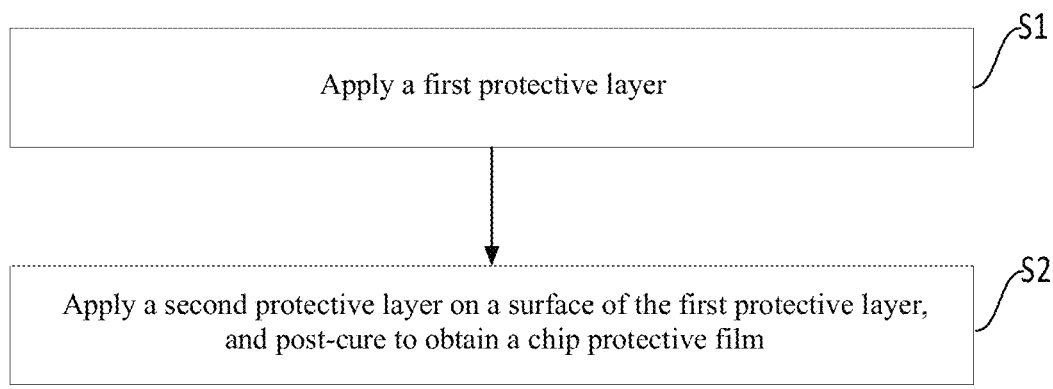
FIG. 1 shows a schematic flow chart of a method of manufacturing a chip protective film according to some embodiments of the present disclosure.

In order that the object, aspects, and advantages of the embodiments of the present disclosure will become more apparent, a more complete description of the embodiments of the present disclosure will be rendered by reference to the appended drawings, which are for purposes of illustration and are not intended to be exhaustive or limiting of the present disclosure. Based on the embodiments in the present disclosure, all other embodiments obtained by those ordinary skills in the art without inventive effort shall fall within the scope of the present disclosure.

The various embodiments of the present disclosure may exist in the form of a range; it should be understood that the description in the form of a range is merely for convenience and brevity and shall not be construed as a rigid limitation on the scope of the present disclosure; accordingly, the description of a range should be considered to have specifically disclosed all the possible subranges as well as individual numerical values within the range. For example, a description of a range from 1 to 6 should be considered to have specifically disclosed subranges, such as from 1 to 3, from 1 to 4, from 1 to 5, from 2 to 4, from 2 to 6, from 3 to 6, as well as individual numbers within the range, such as 1, 2, 3, 4, 5, and 6, in the case of whichever range. Further, whenever a numerical range is indicated in this disclosure, it is meant to include any cited number (fractional or integral) within the indicated range. Unless otherwise specifically noted, the various starting materials, reagents, instruments, equipment, and the like used in the present disclosure are either commercially available or may be prepared by known methods.

In the present disclosure, the use of directional words such as "upper" and "lower" when not stated to the contrary, specifically refers to the direction in the drawings. In addition, in the specification of the present disclosure, the terms "including", "comprising" and the like mean "including, but not limited to". In this disclosure, relational terms such as "first" and "second" are used solely to distinguish one entity or operation from another entity or operation without necessarily requiring or implying any actual such relationship or order between such entities or operations. In this disclosure, "and/or", describing a relationship of associated objects, means that three relationships may exist, for example, A and/or B may mean A is present alone, A and B are both present, and B is present alone, where A and B may be singular or plural. In the present disclosure, "at least one" means one or more, and "plurality" means two or more. "At least one", "at least one of", or the like, refers to any combination of the items, including single items or any combination of plural items. For example, "at least one of a, b, or c" and "at least one of a, b, and c" each may represent a, b, c, a to b (i.e., a and b), a to c, b to c, or a to b to c, where a, b, and c, respectively, may be single or plural.

In a first aspect, the present disclosure provides a chip protective film, including: a first protective layer, and a second protective layer attached to at least a portion of a surface of the first protective layer; the second protective layer includes by mass 90%-97% acrylate compounds, 0.1%-5% fluorine-containing compounds, and a second adjuvant.

The chip protective film includes a first protective layer attached to a surface of a chip substrate and a second protective layer on a surface of the first protective layer. The second protective layer is formed by modifying acrylate compounds with fluorine-containing compounds; on the one hand, a surface of the second protective layer has a lower surface energy, so that the surface has little attraction to other molecules and is smoother, and thus has a very small friction coefficient; on the other hand, intermolecular forces increase because of the introduction of fluorine atoms, resulting in a higher hardness of a polymer. Therefore, a higher hardness and a lower friction coefficient favor better scratch resistance of the chip protective film. Moreover, the adhesion between the first protective layer and the surface of the chip substrate is strong, which further improves the scratch resistance of the chip protective film. In some embodiments, the sum of the content of the second adjuvant and the content of components other than the second adjuvant in the second protective layer is 100% by mass.

In some embodiments, the acrylate compounds include at least one of dipentaerythritol hexaacrylate, pentaerythritol triacrylate, pentaerythritol tetraacrylate, dipentaerythritol hexamethacrylate, polyethylene glycol monomethyl ether methacrylate, and epoxy acrylate resin.

The acrylate compounds such as dipentaerythritol hexaacrylate, pentaerythritol triacrylate, pentaerythritol tetraacrylate, dipentaerythritol hexamethacrylate, polyethylene glycol monomethyl ether methacrylate, and epoxy acrylate resin are used as a base material of the second protective layer to provide a fast UV curing film-forming agent with high hardness and superior gloss characteristics.

In some embodiments, the fluorine-containing compounds include at least one of hexafluoropropylene-modified fluorine-containing compounds, hexafluoropropylene oligomers, and polyoxyethylene ether-modified hexafluoropropylene.

The fluorine-containing compounds such as the hexafluoropropylene-modified fluorine-containing compounds are introduced to make the film surface smoother; many materials are unable to adhere to the surface, making the surface extremely inert, featuring a quite low friction coefficient for its low attraction to other molecules. Because of the introduction of fluorine atoms, intermolecular forces increase, making the polymer harder; and a higher hardness and a lower friction coefficient favor better scratch resistance of the chip protective film. In some specific embodiments, the fluorine-containing compounds may be one or two or more commercially available products such as Model Nos. 602A and 601AD, manufactured by Neos Corporation of Japan.

In some embodiments, the first protective layer has a thickness of 20000 nm to 50000 nm, and the second protective layer has a thickness of 100 nm to 500 nm.

The effect of controlling the thickness of the first protective layer to be 20000 nm to 50000 nm and the thickness of the second protective layer to be 100 nm to 500 nm is to provide the necessary mechanical strength for protecting the chip, so as to avoid crack or breakage when a wafer is cut into chips.

In some embodiments, the second adjuvant includes an initiator and a second colorant.

The initiator and the second colorant are adaptively added for practical purposes. The function of the initiator is to initiate the polymerization of the acrylate compounds and the fluorine-containing compounds, so as to achieve the introduction of the fluorine element and the modification of the acrylate compounds; the initiator includes a cationic initiator, a radical type photoinitiator, etc., and may be the radical type photoinitiator. The function of the second colorant is to provide and improve the color of the protective film; the second colorant may be carbon black.

In some embodiments, the first protective layer includes by mass: 35-40% epoxy resin; 22-28% curing agents; 30-40% silica; and a first adjuvant.

An adhesion between the first protective layer and the chip substrate surface is strong, which further improves the scratch resistance and hardness of the chip protective film. In this example, the silica may be spherical silica (D50 particle size: 0.6 um). In some embodiments, the sum of the content of the first adjuvant and the content of components other than the first adjuvant in the first protective layer is 100% by mass.

In some embodiments, the epoxy resin is a complex of bisphenol A epoxy resin and bisphenol F epoxy resin; the curing agents include naphthol-based curing agents.

The epoxy resin is the complex of bisphenol A epoxy resin and bisphenol F epoxy resin, and a mass ratio of bisphenol A epoxy resin to bisphenol F epoxy resin may be (21 to 26):(10 to 14); in some embodiments, the mass ratio of bisphenol A epoxy resin to bisphenol F epoxy resin is 25:12. In some embodiments, the bisphenol A epoxy resin has an epoxy equivalent of 210 to 250 g/eq., and may be selected from commercially available products such as EPLC-818S manufactured by LOHO Chemical Co. Ltd.; the bisphenol F epoxy resin has an epoxy equivalent of 160-190 g/eq., and may be selected from commercially available products such as NPEF-170 produced by Nanya Plastics. An OH equivalent of the naphthol-based curing agents may be from 100 to 120 g/eq. In some embodiments, the naphthol-based curing agents may be selected from commercially available products such as SN-395 manufactured by CHEM-MAT Technologies, Co., Ltd.

In some embodiments, the first adjuvant includes a curing accelerator and a first colorant.

The curing accelerator and the first coloring agent may be adaptively added according to actual needs to promote the formation of the first protective layer. In some embodiments, the curing accelerator may be selected from phosphorous-based curing accelerators such as triphenylphosphine; the first colorant may be selected, for example, from carbon black and the like.

In a second aspect, the present disclosure provides a method for manufacturing the chip protective film described in the first aspect, including: obtaining a first protective layer; applying a second protective layer on at least a portion of a surface of the first protective layer, and post-curing to obtain the chip protective film.

In some embodiments, in terms of the process parameters, the curing mentioned above is conducted at 140° C.-160° C. for 0.5-2 hours; in some embodiments, the process parameters for the above curing are 150° C. for 1 hour. In some embodiments, the first protective layer and the second protective layer may be coated in advance, transferred to a chip surface by means of a PET heavy-release film and a light-release film, and then cured to obtain the chip protective film on the chip surface; specifically, the second protective layer is applied to the PET heavy-release film followed by the first protective layer and finally the light-release film. In use, the release film is torn off and stuck to a back surface of the chip, and then the heavy-release film is torn off; next, the curing is conducted to obtain the chip protective film on the chip surface. The above "applying" may be performed through conventional methods, such as painting, spray coating, dip coating, electrocoating and other suitable coating methods, according to conventional process steps, which will not be repeated herein. The thickness of the first protective layer is preferably 20000 nm to 50000 nm, and the thickness of the second protective layer is preferably 100 nm to 500 nm.

In the second aspect, the present disclosure provides a chip, including: a chip substrate, and the chip protective film described in the first aspect, which is attached to at least a portion of a surface of the chip substrate.

The chip has excellent scratch resistance because of the surface containing the chip protective film described in the first aspect, and may satisfy practical use requirements. The chip substrate may be a conventional commercially available product or prepared through an existing process, and the type of the chip is not particularly limited in the present disclosure.

The disclosure is further illustrated below in connection with specific examples. It should be understood that these examples are merely illustrative of the present disclosure and are not intended to limit the scope of the present disclosure. Experimental methods for which specific conditions are not specified in the following examples are generally determined according to national standards. If there is no corresponding national standard, the test is conducted according to the general international standard, conventional conditions or the conditions recommended by the manufacturer.

Examples 1 to 6 and Comparative Example 1 provided a chip protective film, and the contents of the components in each example are shown in Table 1. Herein, bisphenol A epoxy resin was EPLC-818S manufactured by LOHO Chemical Co. Ltd.; the naphthol-based curing agent was SN-395 manufactured by CHEM-MAT Technologies Co. Ltd.; bisphenol F epoxy resin was NPEF-170 manufactured by Nanya Plastics. The photopolymerization initiator was IRGACURE 754 produced by BASF. The fluorine-containing compounds were 602A and 601AD from Neos Corporation of Japan.

TABLE 1

| Components (wt %) | Example 1 | Example 2 | Example 3 | Example 4 | Example 5 | Example 6 | Comparative Example 1 |
|---|---|---|---|---|---|---|---|
| First protective layer | | | | | | | |
| Bisphenol A epoxy resin (epoxy equivalent 210-250 g/eq.) | 25 | 25 | 25 | 25 | 25 | 25 | 25 |
| Bisphenol F epoxy resin (epoxy equivalent 160-180 g/eq.) | 12 | 12 | 12 | 12 | 12 | 12 | 12 |
| Naphthol-based curing agents (OH equivalent 100-120 g/eq.) | 25 | 25 | 25 | 25 | 25 | 25 | 25 |
| Phosphorus-based cure accelerator TPP (triphenylphosphine) | 1 | 1 | 1 | 1 | 1 | 1 | 1 |
| Spherical silica (D50 particle size: 0.6 um) | 35 | 35 | 35 | 35 | 35 | 35 | 35 |
| Carbon black | 2 | 2 | 2 | 2 | 2 | 2 | 2 |
| Second protective layer | | | | | | | |
| Dipentaerythritol hexaacrylate | 95 | 94.5 | 93.5 | 95 | 94.5 | 93.5 | |
| Photopolymerization initiator | 4 | 3.5 | 3 | 4 | 3.5 | 3 | |
| Carbon black | 0.5 | 0.5 | 0.5 | 0.5 | 0.5 | 0.5 | |
| 602A | 0.5 | 1.5 | 3 | | | | |
| 601AD | | | | 0.5 | 1.5 | 3 | |

Examples 1 to 6 provided a method for manufacturing a chip protective film, including: S1, coating the second protective layer and then the first protective layer onto the PET heavy-release film, and finally covering with the light-release film; and S2, in use, tearing off the light-release film and transferring same to stick onto the back surface of the chip, and then tearing off the heavy-release film; curing at 150° C. for 1 hour to obtain the chip protective film on the chip surface.

Comparative Example 1 provided a method for manufacturing a chip protective film, including: S1, coating the first protective layer on the PET heavy-release film, and then covering with the light-release film; and S2, in use, tearing off the light-release film and transferring same to stick onto the back surface of the chip, and then tearing off the heavy-release film; curing at 150° C. for 1 hour to obtain the chip protective film on the chip surface.

Performance tests were performed on the chip protective films provided in Examples 1 to 6 and Comparative Example 1, and the test results are shown in Table 2.

Test methods and standards are as follows. Regarding the Shore Hardness, samples of the chip protective films obtained by curing at 150° C. for 1 hour in Examples 1 to 6 and Comparative Example 1 were taken to prepare test samples with a thickness of 1 mm, and the hardness of the cured samples was measured with a Shore Hardness tester. Regarding the PCT cross-cut adhesion rating (reference standard: ASTM D3359-97), a piece of film with a thickness of 40 um and sized 10 cm×10 cm was transferred onto a silicon wafer, cured at 150° C. for 1 hour, subjected to an autoclave PCT 168-hour high-pressure high-temperature high-humidity reliability test (120° C./100% RH/2 atm), and then scribed with a cross-cut tester under uniform pressure, a result of which showed that the film did not fall off. Regarding the pencil hardness, a piece of film with a thickness of 40 um and sized 10 cm×10 cm was transferred onto a silicon wafer and cured at 150° C. for 1 hour, and the resulting chip protective film was tested for the pencil hardness with a pencil hardness tester at an angle of 45° under a load of 1000 g. Regarding the scratch test, a piece of film with a thickness of 40 um and sized 10 cm×10 cm was transferred onto a silicon wafer and cured at 150° C. for 1 hour, and the resulting chip protective film was tested with a scratch tester for 100 cycles of double rub resistance under an applied force of 500 g. Regarding the friction coefficient (reference standard: ISO 8295), a piece of film with a thickness of 40 um and sized 10 cm×10 cm was transferred onto a silicon wafer and cured at 150° C. for 1 hour to obtain the resulting chip protective film, and the test surfaces were put together in planar contact, with the contact pressure applied uniformly; the force required for initial sliding (static friction) and the force of relative sliding between two surfaces (dynamic friction) were recorded.

TABLE 2

|  |  | Example 1 | Example 2 | Example 3 | Example 4 | Example 5 | Example 6 | Comparative Example 1 |
|---|---|---|---|---|---|---|---|---|
| AFM surface roughness | | Rq = 7.33, Ra = 5.51, Rmax = 71.5 | Rq = 4.43, Ra = 3.5, Rmax = 40.6 | Rq = 8.75, Ra = 5.98, Rmax = 86.8 | Rq = 7.84, Ra = 5.94, Rmax = 68.7 | Rq = 5.03, Ra = 3.84, Rmax = 48.9 | Rq = 9.17, Ra = 6.14, Rmax = 124 | Rq = 18.3, Ra = 14.4, Rmax = 137 |
| Pencil hardness | | 5H | 8H | 8H | 4H | 7H | 8H | 2H |
| Shore hardness (Shore D) | | 93 | 95 | 95 | 92 | 94 | 94 | 85 |
| Water drop contact angle | | 81 | 93 | 95 | 84 | 95 | 96 | 64 |
| Friction coefficient | | 0.98 | 0.62 | 1.03 | 1.05 | 0.68 | 1.09 | 2.11 |
| Scratch resistance | | ○ | ◎ | ○ | ○ | ◎ | ○ | Δ |
| Cross-cut adhesion rating (ASTM D3359-97) | PCT 0 day | 0 | 0 | 0 | 0 | 0 | 0 | 0 |
| | PCT 96 hours | 1 | 0 | 0 | 1 | 0 | 0 | 3 |
| | PCT 168 hours | 1 | 0 | 0 | 1 | 0 | 0 | 3 |

Figure 2:
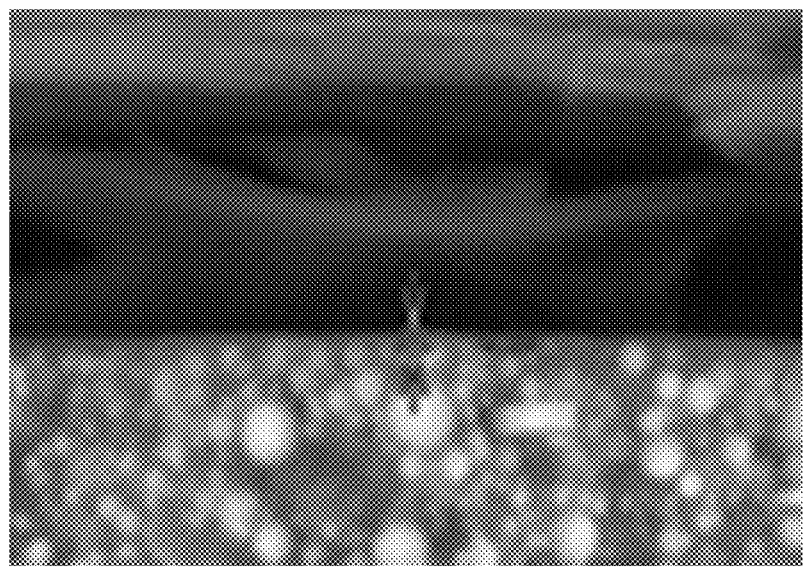
FIG. 2 shows a cross-sectional SEM diagram of the chip protective film according to some embodiments of the present disclosure.
Figure 3:
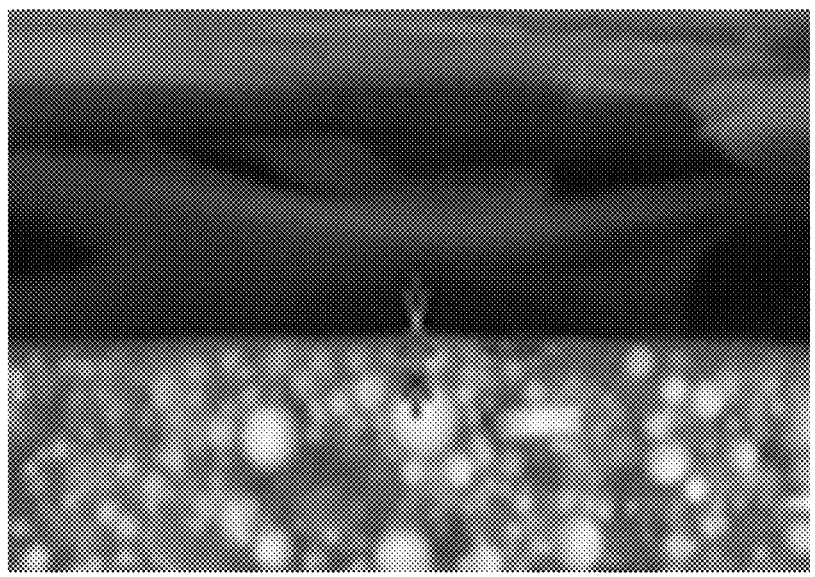
FIG. 3 shows a cross-sectional SEM diagram of the chip protective film according to some embodiments of the present disclosure.

In addition, in the present disclosure, the chip surfaces of Example 1 and Comparative Example 1 were photographed with a 10 kV BSE probe, and the results are shown in FIG. 2 (obtained by photographing Example 1) and FIG. 3 (obtained by photographing Comparative Example 1). As can be seen from FIGS. 2 and 3, Example 1 showed delamination with a thickness reaching approximately 300 nm (i.e., indicated by the "up-down" arrow in FIG. 2), while Comparative Example 1 showed no significant delamination.

In summary, the chip protective film provided by the present disclosure has the features of high adhesion, low friction coefficient, high hardness, and good scratch resistance, and effectively solves the technical problem of the existing chip protective film having no scratch resistance.

The technical solution, as provided in some embodiments of the present disclosure above, has the following advantages over the prior art. The chip protective film includes a first protective layer attached to a surface of a chip substrate and a second protective layer on a surface of the first protective layer. The second protective layer is formed by modifying acrylate compounds with fluorine-containing compounds; on the one hand, a surface of the second protective layer has a lower surface energy, so that the surface has little attraction to other molecules and is smoother, and thus has a very small friction coefficient; on the other hand, intermolecular forces increase because of the introduction of fluorine atoms, resulting in a higher hardness of a polymer. Therefore, a higher hardness and a lower friction coefficient favor better scratch resistance of the chip protective film. Moreover, the adhesion between the first protective layer and the surface of the chip substrate is strong, which further improves the scratch resistance of the chip protective film.

The description above of the disclosed embodiments is provided to enable any person skilled in the art to make or use the present disclosure. Various modifications to these embodiments will be readily apparent to those skilled in the art, and the generic principles defined in this disclosure may be implemented in other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A chip protective film, comprising a first protective layer, and a second protective layer on a surface of the first protective layer, wherein
   the first protective layer is attached to a surface of a chip substrate;
   the first protective layer comprises by mass:
   35-40% epoxy resin; 22-28% curing agents; 30-40% silica; and a first adjuvant, wherein the first adjuvant comprises a first colorant;
   the second protective layer comprises by mass:
   90-97% acrylate compounds; 0.1-5% hexafluoropropylene-modified fluorine-containing compounds; and a second adjuvant;
   wherein the acrylate compounds comprise at least one of dipentaerythritol hexaacrylate, pentaerythritol triacrylate, pentaerythritol tetraacrylate, dipentaerythritol hexamethacrylate, polyethylene glycol monomethyl ether methacrylate, and epoxy acrylate resin; and the second adjuvant comprises an initiator and a second colorant.

2. The chip protective film according to claim 1, wherein the hexafluoropropylene-modified fluorine-containing compound comprises at least one of hexafluoropropylene oligomers and polyoxyethylene ether-modified hexafluoropropylene.

3. The chip protective film according to claim 1, wherein the first protective layer has a thickness of 20000 nm to 50000 nm, and the second protective layer has a thickness of 100 nm to 500 nm.

4. The chip protective film according to claim 1, wherein the epoxy resin is a compound of bisphenol A epoxy resin and bisphenol F epoxy resin; the curing agents comprises a naphthol-based curing agent.

5. The chip protective film according to claim 1, wherein the first adjuvant comprises a curing accelerator.

6. A method for manufacturing the chip protective film according to claim 1, comprising:
   applying a first protective layer; and
   applying a second protective layer on a surface of the first protective layer and post-curing to obtain the chip protective film.

7. A chip, comprising a chip substrate and a protective film attached to at least a portion of a surface of the chip substrate, wherein the protective film is the chip protective film according to claim 1.

* * * * *